(12) United States Patent
Adams et al.

(10) Patent No.: US 7,717,617 B2
(45) Date of Patent: May 18, 2010

(54) MULTIPLE BAND PASS FILTERING FOR PYROMETRY IN LASER BASED ANNEALING SYSTEMS

(75) Inventors: Bruce E. Adams, Portland, OR (US); Dean Jennings, Beverly, MA (US); Aaron M. Hunter, Santa Cruz, CA (US); Abhilash J. Mayur, Salinas, CA (US); Vijay Parihar, Fremont, CA (US); Timothy N. Thomas, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 49 days.

(21) Appl. No.: 12/283,615

(22) Filed: Sep. 12, 2008

(65) Prior Publication Data

US 2009/0084986 A1 Apr. 2, 2009

Related U.S. Application Data

(62) Division of application No. 11/195,380, filed on Aug. 2, 2005, now Pat. No. 7,438,468.

(60) Provisional application No. 60/627,527, filed on Nov. 12, 2004.

(51) Int. Cl.
*G01N 3/28* (2006.01)
*G01J 5/08* (2006.01)
*H01L 21/477* (2006.01)

(52) U.S. Cl. ............... 374/131; 374/161; 374/167; 374/124; 374/141; 356/43

(58) Field of Classification Search ............ 374/120, 374/121, 124, 129, 130, 131, 161, 166, 167, 374/141, E17.002, E7.002, 135, 137; 356/43, 356/495; 372/50.12, 50.122; 250/338.1, 250/338.2, 341.2, 341.1, 341.6, 341.8; 219/121.75, 219/121.73, 121.61, 121.76; 438/663
See application file for complete search history.

(56) References Cited

U.S. PATENT DOCUMENTS

| | | | |
|---|---|---|---|
| 3,778,791 A | 12/1973 | Lewicki et al. | 179/100.2 |
| 4,099,875 A | 7/1978 | McMahon et al. | 356/342 |
| 4,305,640 A | 12/1981 | Cullis et al. | 350/96.1 |
| 4,448,547 A | 5/1984 | Wickersheim | 374/131 |
| 4,647,774 A | 3/1987 | Brisk et al. | 250/338 |

(Continued)

FOREIGN PATENT DOCUMENTS

| | | |
|---|---|---|
| DE | 10339237 A1 | 3/2004 |
| EP | 0 231 794 A2 | 8/1987 |
| EP | 0458388 A1 | 11/1991 |
| JP | 57099747 A | 6/1982 |
| JP | 200191231 A | 3/2000 |
| WO | WO 03/089184 A1 | 10/2003 |
| WO | WO 2004/044955 | 5/2004 |

OTHER PUBLICATIONS

Official Action Dated Jul. 20, 2009 in Co-Pending U.S. Appl. No. 11/198,660.

*Primary Examiner*—Gail Verbitsky
(74) *Attorney, Agent, or Firm*—Law Office of Robert M. Wallace

(57) ABSTRACT

A thermal processing system includes a source of laser radiation emitting at a laser wavelength, beam projection optics disposed between the reflective surface and a substrate support capable of holding a substrate to be processed, a pyrometer responsive to a pyrometer wavelength, and a wavelength responsive optical element having a first optical path for light in a first wavelength range including the laser wavelength, the first optical path being between the source of laser radiation and the beam projection optics, and a second optical path for light in a second wavelength range including the pyrometer wavelength, the second optical path being between the beam projection optics and the pyrometer. The system can further include a pyrometer wavelength blocking filter between the source of laser radiation and the wavelength responsive optical element.

24 Claims, 4 Drawing Sheets

U.S. PATENT DOCUMENTS

| | | | |
|---|---|---|---|
| 4,730,113 A | 3/1988 | Edwards | 250/347 |
| 5,238,858 A | 8/1993 | Matsushita | 438/529 |
| 5,463,202 A | 10/1995 | Kurosawa et al. | 219/121.83 |
| 5,861,992 A | 1/1999 | Gelbart | 359/619 |
| 6,080,236 A | 6/2000 | McCulloch et al. | 117/4 |
| 6,240,116 B1 | 5/2001 | Lang et al. | 372/50 |
| 6,494,371 B1 | 12/2002 | Rekow et al. | 235/454 |
| 6,530,687 B1 | 3/2003 | Suzuki et al. | 374/131 |
| 6,531,681 B1 | 3/2003 | Markle et al. | 219/121.69 |
| 6,747,245 B2 | 6/2004 | Talwar et al. | 219/121.8 |
| 6,771,686 B1 | 8/2004 | Ullman et al. | 372/92 |
| 6,780,692 B2 | 8/2004 | Tatsuiki et al. | 438/166 |
| 6,809,012 B2 | 10/2004 | Yamazaki et al. | 438/473 |
| 6,847,457 B2 * | 1/2005 | Tobiason et al. | 356/495 |
| 6,895,164 B2 | 5/2005 | Saccomanno | 385/146 |
| 6,987,240 B2 | 1/2006 | Jennings et al. | 219/121.8 |
| 7,005,601 B2 | 2/2006 | Jennings | 219/121.66 |
| 7,129,440 B2 | 10/2006 | Adams et al. | 219/121.65 |
| 7,135,392 B1 | 11/2006 | Adams et al. | 438/166 |
| 7,494,272 B2 * | 2/2009 | Thomas et al. | 374/53 |
| 2003/0196996 A1 | 10/2003 | Jennings et al. | 219/121.73 |
| 2004/0095983 A1 | 5/2004 | Whitley | 372/108 |
| 2004/0149217 A1 | 8/2004 | Collins et al. | 118/723 |
| 2004/0179807 A1 | 9/2004 | Tanaka | 385/146 |
| 2004/0188399 A1 | 9/2004 | Smart | 219/121.69 |
| 2004/0198028 A1 | 10/2004 | Tanaka et al. | 438/487 |
| 2004/0263986 A1 | 12/2004 | Brown | 359/626 |
| 2005/0063451 A1 * | 3/2005 | Abe et al. | 374/121 |
| 2005/0175285 A1 | 8/2005 | Reynolds et al. | 385/39 |
| 2006/0008237 A1 | 1/2006 | Imade | 385/146 |
| 2006/0102607 A1 | 5/2006 | Adams et al. | 374/126 |
| 2006/0105585 A1 | 5/2006 | Jennings et al. | 438/473 |
| 2008/0025368 A1 * | 1/2008 | Aderhold et al. | 374/102 |
| 2008/0210671 A1 * | 9/2008 | Jennings et al. | 219/121.61 |
| 2009/0200279 A1 * | 8/2009 | Li | 219/121.66 |
| 2009/0296774 A1 * | 12/2009 | Koelmel et al. | 374/121 |

* cited by examiner

MULTIPLE BAND PASS FILTERING FOR PYROMETRY IN LASER BASED ANNEALING SYSTEMS

CROSS REFERENCE TO RELATED APPLICATIONS

This application is a divisional of U.S. application Ser. No. 11/195,380, filed Aug. 2, 2005 now U.S. Pat. No. 7,438,468 entitled MULTIPLE BAND PASS FILTERING FOR PYROMETRY IN LASER BASED ANNEALING SYSTEMS by Bruce E. Adams, et al., which claims the benefit of U.S. Provisional Application No. 60/627,527, filed Nov. 12, 2004.

This application contains subject matter related to U.S. Pat. No. 7,422,988, issued Sep. 9, 2008 entitled RAPID DETECTION OF IMMINENT FAILURE IN LASER THERMAL PROCESSING OF A SUBSTRATE by Bruce Adams, et al.; U.S. Pat. No. 7,129,440, issued Oct. 31, 2006 entitled SINGLE AXIS LIGHT PIPE FOR HOMOGENIZING SLOW AXIS OF ILLUMINATION SYSTEMS BASED ON LASER DIODES by Bruce Adams, et al.; U.S. Pat. No. 7,135,392, issued Nov. 14, 2006 entitled THERMAL FLUX LASER ANNEALING FOR ION IMPLANTATION OF SEMICONDUCTOR P-N JUNCTIONS by Bruce Adams, et al.; and U.S. application Ser. No. 11/198,660, filed Aug. 5, 2005 entitled AUTOFOCUS FOR HIGH POWER LASER DIODE BASED ANNEALING SYSTEM by Dean Jennings, et al., all of which applications are assigned to the present assignee.

FIELD OF THE INVENTION

The invention relates generally to thermal processing of semiconductor substrates. In particular, the invention relates to laser thermal processing of semiconductor substrates.

BACKGROUND

Thermal processing is required in the fabrication of silicon and other semiconductor integrated circuits formed in silicon wafers or other substrates such as glass panels for displays. The required temperatures may range from relatively low temperatures of less than 250° C. to greater than 1000°, 1200°, or even 1400° C. and may be used for a variety of processes such as dopant implant annealing, crystallization, oxidation, nitridation, silicidation, and chemical vapor deposition as well as others.

For the very shallow circuit features required for advanced integrated circuits, it is greatly desired to reduce the total thermal budget in achieving the required thermal processing. The thermal budget may be considered as the total time at high temperatures necessary to achieve the desired processing temperature. The time that the wafer needs to stay at the highest temperature can be very short.

Rapid thermal processing (RTP) uses radiant lamps which can be very quickly turned on and off to heat only the wafer and not the rest of the chamber. Pulsed laser annealing using very short (about 20 ns) laser pulses is effective at heating only the surface layer and not the underlying wafer, thus allowing very short ramp up and ramp down rates.

A more recently developed approach in various forms, sometimes called thermal flux laser annealing or dynamic surface annealing (DSA), is described by Jennings et al. in PCT/2003/00196966 based upon U.S. Pat. No. 6,987,240, issued Jan. 17, 2006 and incorporated herein by reference in its entirety. Markle describes a different form in U.S. Pat. No. 6,531,681 and Talwar yet a further version in U.S. Pat. No. 6,747,245.

The Jennings and Markle versions use CW diode lasers to produce very intense beams of light that strikes the wafer as a thin long line of radiation. The line is then scanned over the surface of the wafer in a direction perpendicular to the long dimension of the line beam.

SUMMARY

A thermal processing system includes a source of laser radiation emitting at a laser wavelength, beam projection optics disposed between the reflective surface and a substrate support capable of holding a substrate to be processed, a pyrometer responsive to a pyrometer wavelength, and a wavelength responsive optical element having a first optical path for light in a first wavelength range including the laser wavelength, the first optical path being between the source of laser radiation and the beam projection optics, and a second optical path for light in a second wavelength range including the pyrometer wavelength, the second optical path being between the beam projection optics and the pyrometer. The system can further include a pyrometer wavelength blocking filter between the source of laser radiation and the wavelength responsive optical element. Preferably, the pyrometer includes a photodetector and a laser wavelength blocking filter. In a preferred embodiment, the source of laser radiation includes an array of laser emitters and the pyrometer wavelength blocking filter comprises a reflective surface angled relative to the array whereby to reflect light of the pyrometer wavelength to zones between adjacent ones of the emitters. In a preferred embodiment, the beam projection optics projects a line beam of radiation of the laser wavelength onto a substrate plane over the substrate support, and the system further includes a line beam scanning apparatus having a fast axis transverse to the line beam.

DETAILED DESCRIPTION

Figure 1:
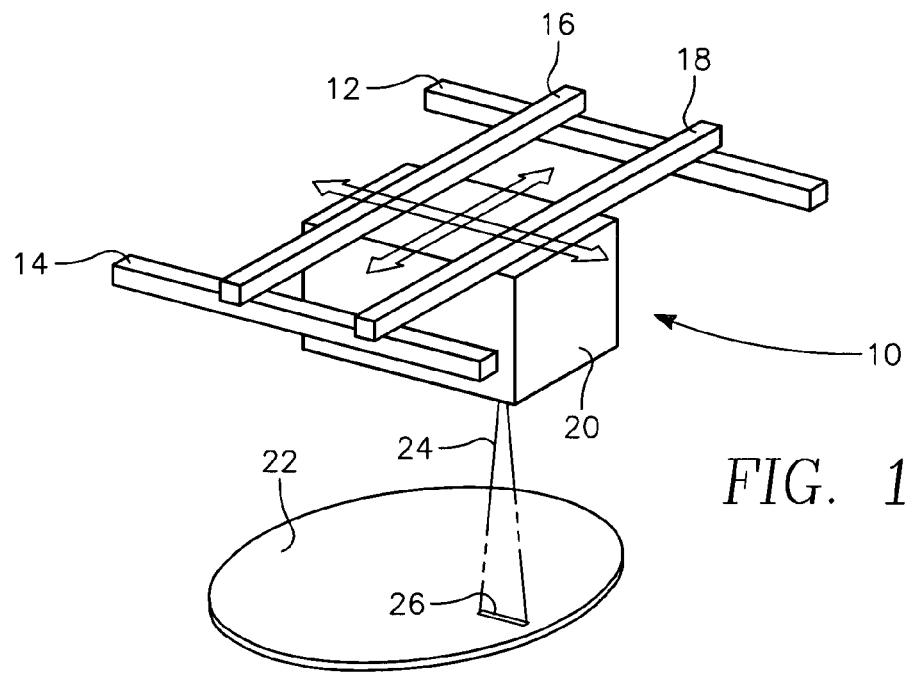
FIG. 1 is an orthographic representation of a thermal flux laser annealing apparatus employed in the present invention.

One embodiment of the apparatus described in the above-referenced application by Jennings et al. is illustrated in the schematic orthographic representation of FIG. 1. A gantry structure 10 for two-dimensional scanning includes a pair of fixed parallel rails 12, 14. Two parallel gantry beams 16, 18 are fixed together a set distance apart and supported on the fixed rails 12, 14 and are controlled by an unillustrated motor and drive mechanism to slide on rollers or ball bearings together along the fixed rails 12, 14. A beam source 20 is slidably supported on the gantry beams 16, 18, and may be suspended below the beams 16, 18 which are controlled by unillustrated motors and drive mechanisms to slide along them. A silicon wafer 22 or other substrate is stationarily supported below the gantry structure 10. The beam source 20 includes a laser light source and optics to produce a downwardly directed fan-shaped beam 24 that strikes the wafer 22 as a line beam 26 extending generally parallel to the fixed rails 12, 14, in what is conveniently called the slow direction. Although not illustrated here, the gantry structure further includes a Z-axis stage for moving the laser light source and optics in a direction generally parallel to the fan-shaped beam 24 to thereby controllably vary the distance between the beam source 20 and the wafer 22 and thus control the focusing of the line beam 26 on the wafer 22. Exemplary dimensions of the line beam 26 include a length of 1 cm and a width of 66 microns with an exemplary power density of 220 kW/cm$^2$. Alternatively, the beam source and associated optics may be stationary while the wafer is supported on a stage which scans it in two dimensions.

In typical operation, the gantry beams 16, 18 are set at a particular position along the fixed rails 12, 14 and the beam source 20 is moved at a uniform speed along the gantry beams 16, 18 to scan the line beam 26 perpendicularly to its long dimension in a direction conveniently called the fast direction. The line beam 26 is thereby scanned from one side of the wafer 22 to the other to irradiate a 1 cm swath of the wafer 22. The line beam 26 is narrow enough and the scanning speed in the fast direction fast enough that a particular area of the wafer is only momentarily exposed to the optical radiation of the line beam 26 but the intensity at the peak of the line beam is enough to heat the surface region to very high temperatures. However, the deeper portions of the wafer 22 are not significantly heated and further act as a heat sink to quickly cool the surface region. Once the fast scan has been completed, the gantry beams 16, 18 are moved along the fixed rails 12, 14 to a new position such that the line beam 26 is moved along its long dimension extending along the slow axis. The fast scanning is then performed to irradiate a neighboring swath of the wafer 22. The alternating fast and slow scanning are repeated, perhaps in a serpentine path of the beam source 20, until the entire wafer 22 has been thermally processed.

The optics beam source 20 includes an array of lasers. An example is orthographically illustrated in FIGS. 2 and 3, in which laser radiation at about 810 nm is produced in an optical system 30 from two laser bar stacks 32, one of which is illustrated in end plan view in FIG. 4. Each laser bar stack 32 includes 14 parallel bars 34, generally corresponding to a vertical p-n junction in a GaAs semiconductor structure, extending laterally about 1 cm and separated by about 0.9 mm. Typically, water cooling layers are disposed between the bars 34. In each bar 34 are formed 49 emitters 36, each constituting a separate GaAs laser emitting respective beams having different divergence angles in orthogonal directions. The illustrated bars 34 are positioned with their long dimension extending over multiple emitters 36 and aligned along the slow axis and their short dimension corresponding to the less than 1-micron p-n depletion layer aligned along the fast axis. The small source size along the fast axis allows effective collimation along the fast axis. The divergence angle is large along the fast axis and relatively small along the slow axis.

Returning to FIGS. 2 and 3 two arrays of cylindrical lenslets 40 are positioned along the laser bars 34 to collimate the laser light in a narrow beam along the fast axis. They may be bonded with adhesive on the laser stacks 32 and aligned with the bars 34 to extend over the emitting areas 36.

Figure 2:
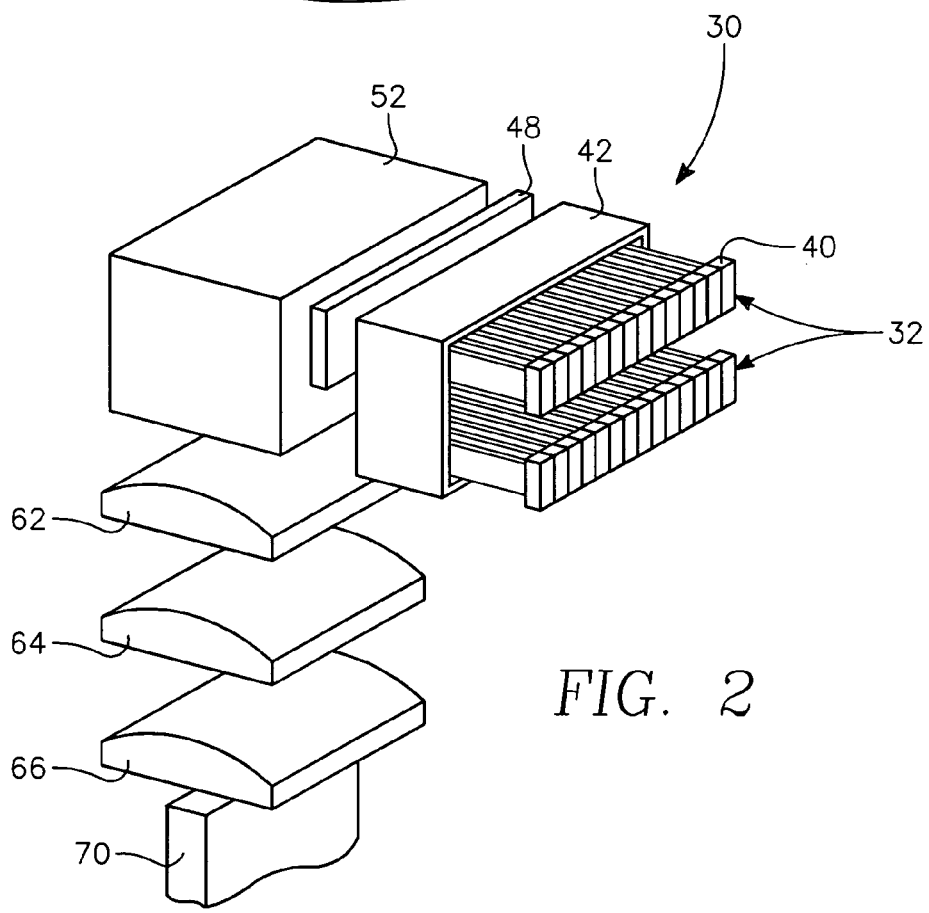
FIGS. 2 and 3 are orthographic views from different perspectives of optical components of the apparatus of FIG. 1.
Figure 3:
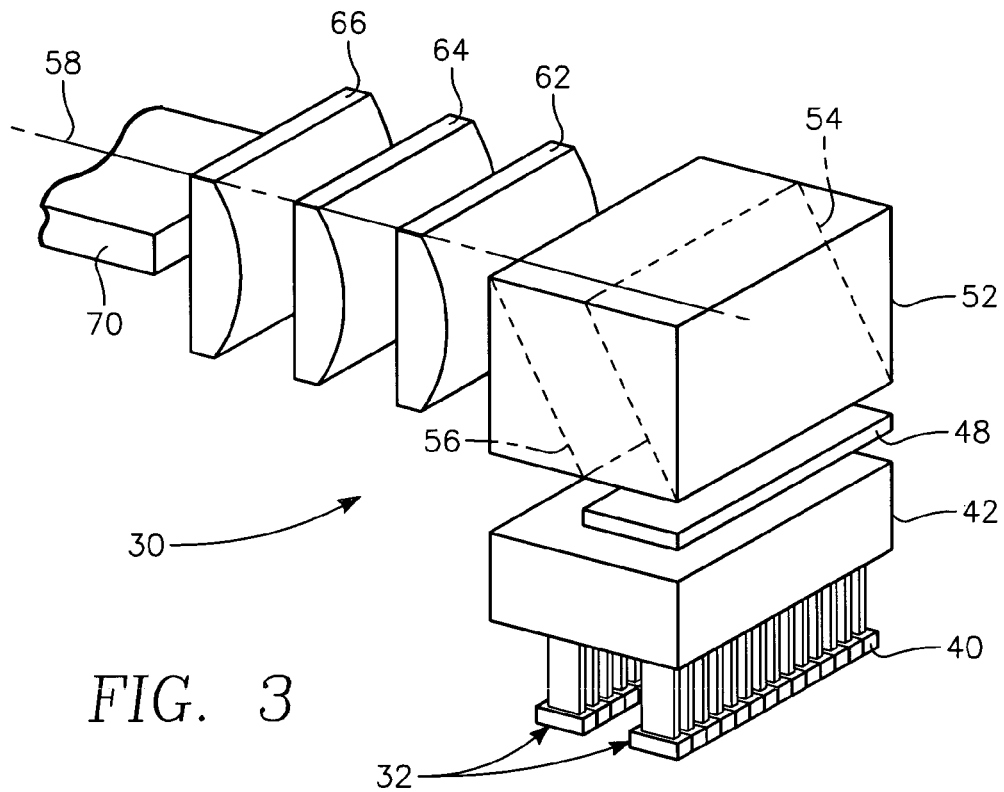
Figure 4:
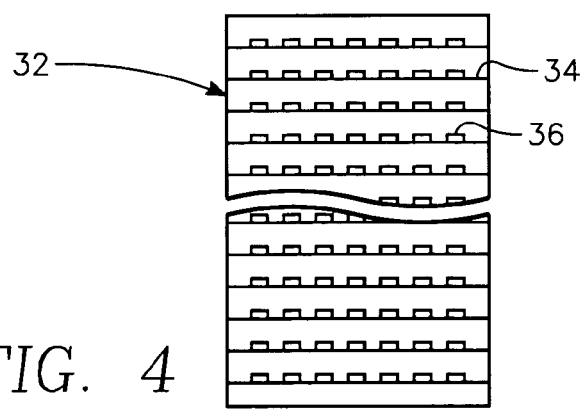
FIG. 4 is an end plan view of a portion of a semiconductor laser array in the apparatus of FIG. 1.

The optics beam source 20 can further include conventional optical elements. Such conventional optical elements can include an interleaver and a polarization multiplexer, although the selection by the skilled worker of such elements is not limited to such an example. In the example of FIGS. 2 and 3, the two sets of beams from the two bar stacks 32 are input to an interleaver 42, which has a multiple beam splitter type of structure and having specified coatings on two internal diagonal faces, e.g., reflective parallel bands, to selectively reflect and transmit light. Such interleavers are commercially available from Research Electro Optics (REO). In the interleaver 42, patterned metallic reflector bands are formed in angled surfaces for each set of beams from the two bar stacks 32 such that beams from bars 34 on one side of the stack 32 are alternatively reflected or transmitted and thereby interleaved with beams from bars 34 on the other side of the stack 32 which undergo corresponding selective transmission/reflection, thereby filling in the otherwise spaced radiation profile from the separated emitters 36.

A first set of interleaved beams is passed through a quarter-wave plate 48 to rotate its polarization relative to that of the second set of interleaved beams. Both sets of interleaved beams are input to a polarization multiplexer (PMUX) 52 having a structure of a double polarization beam splitter. Such a PMUX is commercially available from Research Electro Optics. First and second diagonal interface layers 54, 56 cause the two sets of interleaved beams to be reflected along a common axis from their front faces. The first interface 54 is typically implemented as a dielectric interference filter designed as a hard reflector (HR) while the second interface 56 is implemented as a dielectric interference filter designed as a polarization beam splitter (PBS) at the laser wavelength. As a result, the first set of interleaved beams reflected from the first interface layer 54 strikes the back of the second interface layer 56. Because of the polarization rotation introduced by the quarter-wave plate 48, the first set of interleaved beams passes through the second interface layer 56. The intensity of a source beam 58 output by the PMUX 52 is doubled from that of the either of the two sets of interleaved beams.

Although shown separated in the drawings, the interleaver 42, the quarter-wave plate 48, and the PMUX 52 and its interfaces 54, 56, as well as additional filters that may be attached to input and output faces are typically joined together by a plastic encapsulant, such as a UV curable epoxy, to provide a rigid optical system. An important interface is the plastic bonding of the lenslets 40 to the laser stacks 32, on which they must be aligned to the bars 34. The source beam 58 is passed through a set of cylindrical lenses 62, 64, 66 to focus the source beam 58 along the slow axis.

Figure 5:
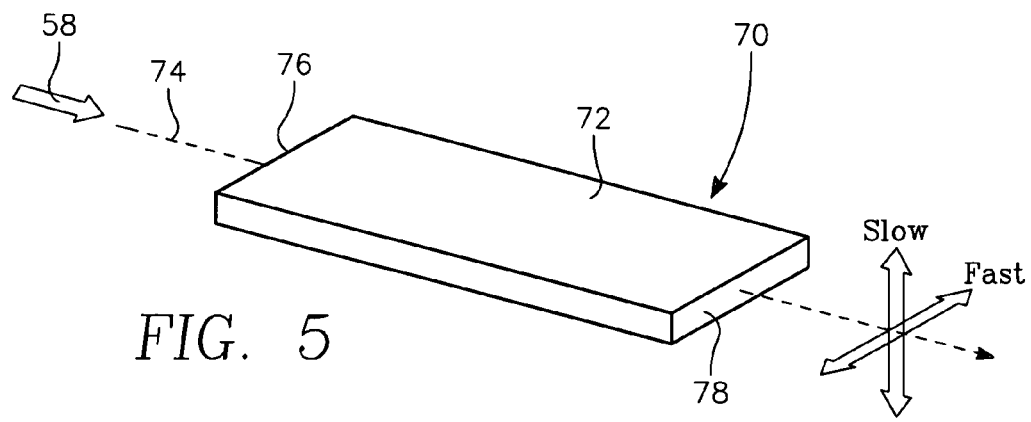
FIG. 5 is an orthographic view of a homogenizing light pipe for the apparatus of FIG. 1.

A one-dimensional light pipe 70 homogenizes the source beam along the slow axis. The source beam, focused by the cylindrical lenses 62, 64, 66, enters the light pipe 70 with a finite convergence angle along the slow axis but substantially collimated along the fast axis. The light pipe 70, more clearly illustrated in the orthographic view of FIG. 5, acts as a beam homogenizer to reduce the beam structure along the slow axis introduced by the multiple emitters 36 in the bar stack 32 spaced apart on the slow axis. The light pipe 70 may be implemented as a rectangular slab 72 of optical glass having a sufficiently high index of refraction to produce total internal reflection. It has a short dimension along the slow axis and a longer dimension along the fast axis. The slab 72 extends a substantial distance along an axis 74 of the source beam 58 converging along the slow axis on an input face 76. The source beam 58 is internally reflected several times from the top and bottom surfaces of the slab 72, thereby removing much of the texturing along the slow axis and homogenizing the beam along the slow axis when it exits on an output face 78. The source beam 58, however, is already well collimated along the fast axis (by the cylindrical lenslets 40) and the slab 72 is wide enough that the source beam 58 is not internally reflected on the side surfaces of the slab 72 but maintains its collimation along the fast axis. The light pipe 70 may be tapered along its axial direction to control the entrance and exit apertures and beam convergence and divergence. The one-dimensional light pipe can alternatively be implemented as two parallel reflective surfaces corresponding generally to the upper and lower faces of the slab 72 with the source beam passing between them.

The source beam output by the light pipe 70 is generally uniform. As further illustrated in the schematic view of FIG. 6, further anamorphic lens set or optics 80, 82 expands the output beam in the slow axis and includes a generally spherical lens to project the desired line beam 26 on the wafer 22. The anamorphic optics 80, 82 shape the source beam in two dimensions to produce a narrow line beam of limited length. In the direction of the fast axis, the output optics have an infinite conjugate for the source at the output of the light pipe (although systems may be designed with a finite source conjugate) and a finite conjugate at the image plane of the wafer 22 while, in the direction of the slow axis, the output optics has a finite conjugate at the source at the output of the light pipe 70 and a finite conjugate at the image plane. Further, in the direction of the slow axis, the nonuniform radiation from the multiple laser diodes of the laser bars is homogenized by the light pipe 70. The ability of the light pipe 70 to homogenize strongly depends on the number of times the light is reflected traversing the light pipe 70. This number is determined by the length of the light pipe 70, the direction of the taper if any, the size of the entrance and exit apertures as well as the launch angle into the light pipe 70. Further anamorphic optics focus the source beam into the line beam of desired dimensions on the surface of the wafer 22.

A recurring problem with RTP and other types of radiant thermal processing is monitoring the temperature of the wafer being so thermally processed. Temperature measurement is desired because the amount of light coupled into the wafer strongly depends upon the surface structure already formed in the wafer. Furthermore, light source conditions may vary somewhat. Wide-angle pyrometers are generally used with RTP to monitor large portions of the wafer. Such pyrometers are generally inappropriate for focused laser beams irradiating only a small area of the wafer at any time, leaving the bulk of the wafer near ambient temperature.

Figure 6:
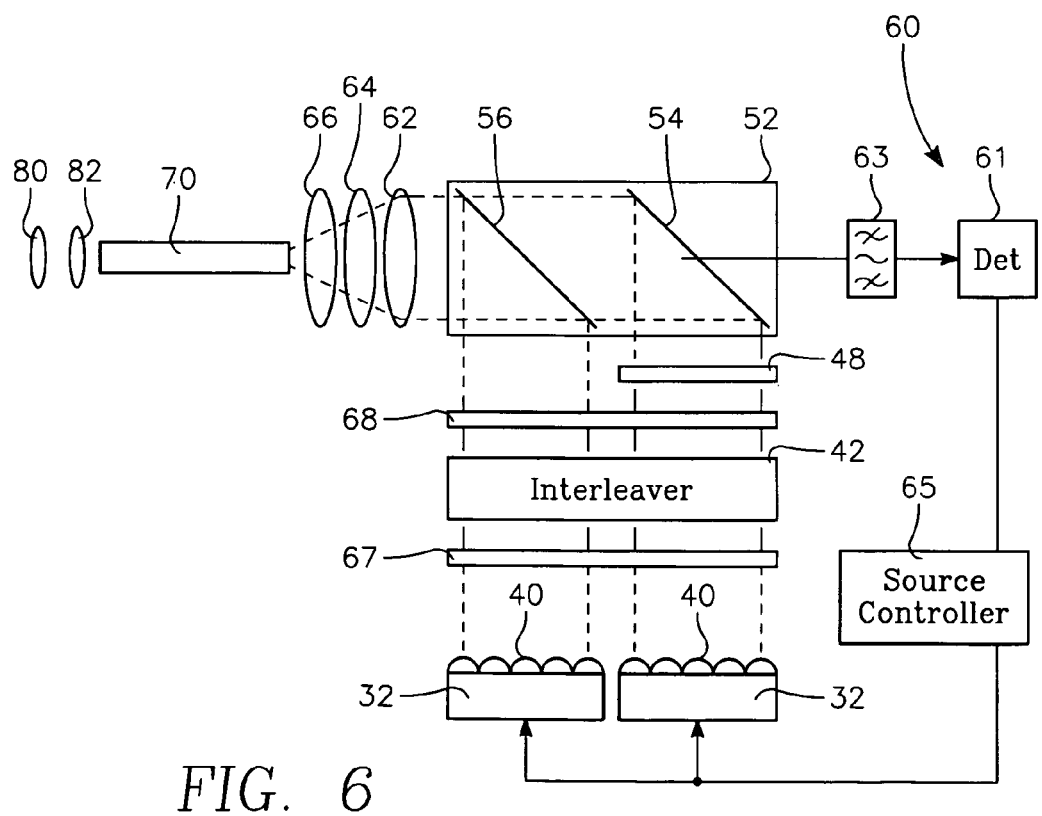
FIG. 6 is a schematic diagram of a system including the features of FIGS. 2-4 in accordance with a preferred embodiment.

One aspect of the invention uses the same optics used to focus the laser source light on the wafer to direct thermal radiation emitted from the neighborhood of the line beam 26 on the wafer 22 in the reverse direction to a pyrometer 60, schematically illustrated in FIG. 6, including an optical detector 61, such as a photodiode, and an optical filter 63 blocking the wavelength, e.g., 810 nm, of the laser radiation. The pyrometer filter 63 preferably is a narrow passband filter centered at a region of the Plankian blackbody radiation curve which is quickly changing at the temperatures of interest. A preferred pyrometer passband is centered at 1550 nm (in which case the detector 61 may be an InGaAs photodiode). As one of many alternatives, the pyrometer passband may be centered at 950 nm (in which case the detector 61 may be a Si photodiode). The passband may extend over a few tens of nm for the shorter wavelength and perhaps 100 nm at the longer wavelength. The optics are generally reciprocal and thus in the reverse direction detect only a small area of the wafer 22 on or very near to the line beam 26 and optically expands that image to an area generally having a size of the emission face of the bar stacks. Although with small laser-beam annealing, there is significant variation of surface layer temperatures even in the immediate neighborhood of the line beam 26, the nature of the Plankian blackbody spectrum causes the hottest areas to dominate the thermally emitted radiation. Typically narrow band interference filters 63 are used having a passband near 1550 nm or 950 nm which block the laser wavelength at 810 nm by several orders of magnitude and substantially block the laser spontaneous emission away from the pyrometer wavelength. The two PMUX interfaces 54, 56 are designed to pass the pyrometer wavelength irrespective of its polarization. Such a function can be implemented with interference mirrors tuned to the 810 nm source radiation and not the pyrometer wavelength. The more conventional interfaces 54, 56 are designed such that the first interface 54 is a hard-reflector (HR) interference filter but the second interface 56 is a polarization beam splitter (PBS) tuned to 810 nm or other laser wavelength. For the invention, the interference filter at the PBS interface 56 is detuned to the extent that it passes a substantial portion (e.g. 72%) of a first polarization at the pyrometer wavelength while reflecting the first polarization of the laser light (or at least most of it). Likewise, the interference filter in the HR interface 54 is redesigned such that it passes a large fraction (e.g., 90%) of the first polarization at the pyrometer wavelength while reflecting most of the other polarization of both wavelengths. As a result of the filtering of both the PMUX interfaces 54, 56 and the narrow band pyrometer filter 63, the photodetector 61 receives only the narrow-band optical signal in a portion of the thermal (blackbody radiation) spectrum. Thus, an optical filter or path that blocks or admits a particular wavelength in the invention is sufficient even though it does not completely block or completely admit all of the light at that wavelength.

The output of the photodetector 61 is supplied to a source controller 65, which converts the detected photocurrent to a wafer temperature and compares it to a desired temperature and thereby adjusts the power supplied to the laser bars 32 to increase or decrease their optical output in the direction of the desired wafer temperature.

A difficulty with this approach is that the GaAs or other semiconductor lasers have a fairly wide spectrum of low-level spontaneous emission that typically overlaps the pyrometer wavelength. As a result of the spontaneous emission, which the pyrometer filter 63 does not block at the pyrometer wavelength, the photodetector 61 would detect both: (a) the wafer blackbody radiation at the pyrometer wavelength and (b) the portion of the laser source spontaneous emission at the pyrometer wavelength, in the absence of additional filtering.

The pyrometer performance can be greatly improved by filtering out the laser source spontaneous radiation at the pyrometer wavelength with a notch filter 67 placed between the bar stacks 32 and the interleaver 42 or a notch filter 68 placed between the interleaver 42 and the PMUX 52. The notch filter 67 or 68 blocks the source radiation at the pyrometer wavelength, specifically whatever wavelengths are passed by the pyrometer filter 63, e.g. 1550 nm or 950 nm, and pass at least the laser radiation at 810 nm. The ratio of the transmission coefficient of the laser wavelength to that of pyrometer wavelength should be several orders of magnitude. A minimum requirement of the filters 67, 68 is that they block wavelengths longer than the laser wavelength, e.g., 810 nm, although radiation at shorter wavelengths does not inherently degrade the pyrometer. The notch filters 67, 68 may be easily implemented as interference filters coated on either the interleaver 42 or the PMUX 52, although they may be implemented as stand alone filters.

Figure 7:
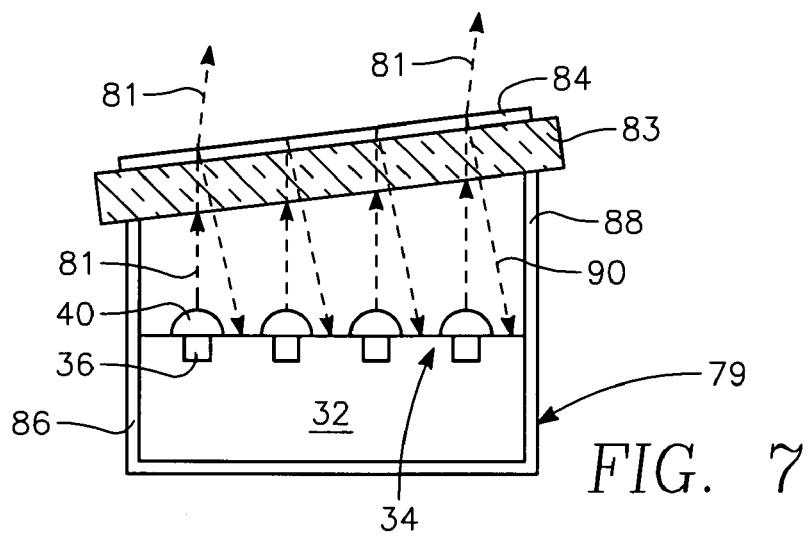
FIGS. 7, 8 and 9 are elevational sectional views of different embodiments of a pyrometer wavelength blocking optical filter of the invention.

An advantageous form of the first notch filter 67, illustrated in cross section in FIG. 7, includes a housing 79 in which each laser stack 32 is placed and the lenslets 40 are bonded with adhesive to the laser stacks in over the emitting areas 36. The lenslets 40 are small cylindrical lenses extending along the laser bars 34 extending perpendicularly to the illustration to produce generally collimated beams. The top of the housing 79 is sealed with a flat window or window slab 83 of Infrasil (optical quartz) on which an interference filter 84, corresponding to pyrometer filter 67, is formed to selectively reflect the pyrometer wavelength and pass the laser wavelength. Anti-reflective coatings for the laser radiation may be formed on either or both sides of the window 83. The sealed structure has the advantage that if the lenslets 40 delaminate from the laser stack 32 and the misalignment causes thermal runaway at the laser source, the organic contamination is restricted to the inside of the housing and does not affect the downstream optics.

However, the reflected radiation produces problems at the laser bars due to both thermal heating and mode hopping. To solve this problem, wall 86, 88 of the housing have unequal height so that the window 83 and attached filter 84 are tilted at about 1° or other appropriate angle relative to a plane perpendicular to the incident beams 81. As a result, the reflected radiation at the pyrometer wavelength is reflected at an oblique angle in reflected beams 90 that strike the laser stacks 32 in zones between the emitting areas, that is, between the stacked bars 34. The radiation is thereby not coupled into the laser structure. A further advantage of the tilted window 83 is that any reflected laser radiation is also deflected away from the emitting areas 36. Further, the layers of the bar stack between the bars 34 typically contain water cooling channels (not shown) so the thermal energy of the reflected radiation is immediately absorbed. The housing 79 and sealed window 83 should constitute a sufficiently impermeable structure, so that any evaporated residue resulting from failure is confined within the structure for a time sufficient to detect the failure and remove power to the laser stack 32.

Figure 8:
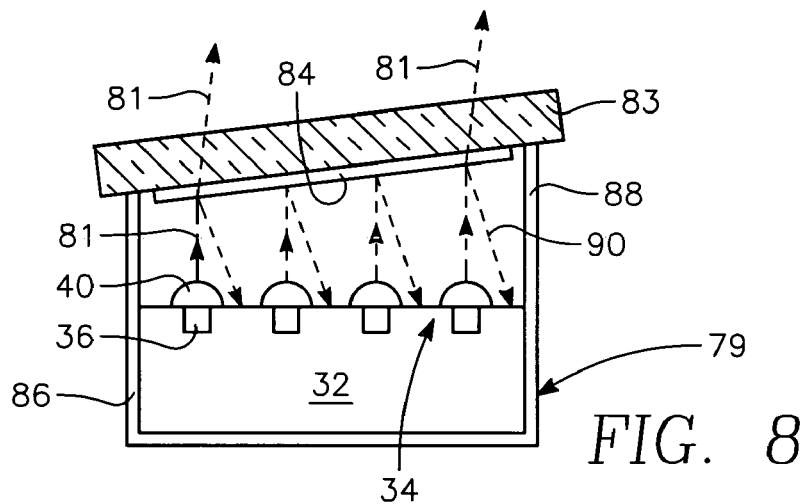
Figure 9:
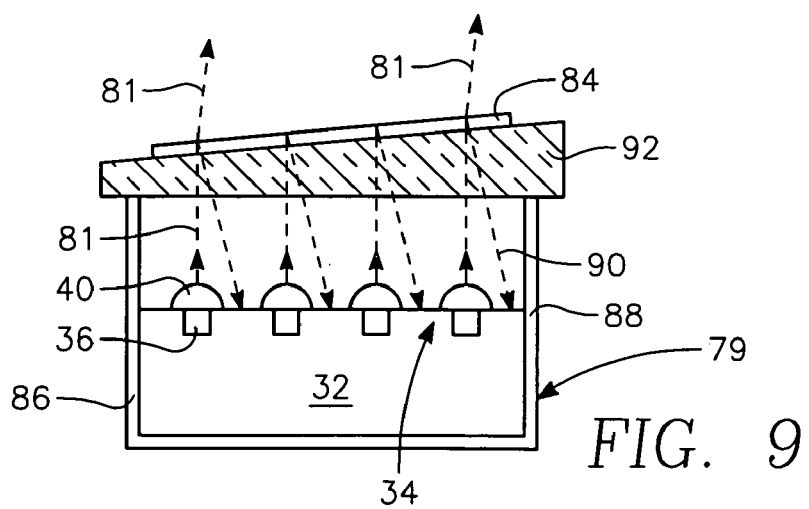

An alternative structure illustrated in the cross sectional view of FIG. 8 places the pyrometer filter 84 on the bottom of the tilted window 83 within the sealed housing so its failure is also confined to the interior of the housing 79. A further alternative structure illustrated in the cross sectional view of FIG. 9 has housing sidewalls 86, 88 of equal height. A wedge-shaped window 92 sits flat on the sidewalls 86, 88 but the pyrometer filter 84 is tilted with respected to the emitted beams 81 on the top face of the wedged window 92.

The anamorphic optics between the optical source and the wafer typically include anti-reflection coatings. With the invention, the anti-reflection and other coatings need to be designed not only for the laser wavelength but also for the pyrometer wavelength.

Although the invention has been described for scanned line beams, it may also be applied to pulsed laser systems sequentially irradiating adjacent portions of the substrate. However, the CW scanned operation is advantageous in that the pyrometer is imaged with a scanned region that, from the view point of the pyrometer, is of temporally unvarying temperature.

With some redesign in the overall system, the wavelength filtering performed by the PMUX interfaces can be replaced by selective transmission at the laser wavelength and selective reflection at the pyrometer wavelength. It may be possible to carry out the invention without either the interleaver 42 or the polarization multiplexer 52 or without both of them. As one possible example, an optical element similar to the reflective surfaces 54, 56 (or similar to one of them) may be employed to carry out the invention, that element not being part of a polarization multiplexer.

While the invention has been described in detail by specific reference to preferred embodiments, it is understood that variations and modifications thereof may be made without departing from the true spirit and scope of the invention.

What is claimed is:

1. Apparatus for processing a wafer, wherein the wafer has a wafer surface, comprising:
    a source of laser radiation, wherein the laser radiation has at least one-laser wavelength which a semiconductor material can absorb as heat;
    an optical element having a surface to reflect radiation at the laser wavelength and to pass radiation at a pyrometer wavelength;
    optics providing an optical line beam derived from the source of laser radiation, the optical line beam focused on the wafer, the optics disposed between the surface of the optical element and the wafer, the optical line beam defining a portion of the wafer surface, which is smaller than the wafer surface, within which illumination by the laser radiation is focused;
    line beam scanning apparatus coupled to the optics and having a fast axis transverse to the optical line beam along which the portion is translatable by the line beam scanning apparatus at a beam translation rate;
    a pyrometer positioned on a side of the surface of the optical element opposite said optics to receive an image of said portion through the optics, wherein the pyrometer is sensitive to the pyrometer wavelength; and
    a first optical filter disposed between the source of laser radiation and the surface of the optical element to block a part of the radiation spectrum from the source of laser radiation including the pyrometer wavelength.

2. The apparatus of claim 1 wherein said portion is sufficiently small so that the laser radiation focused thereon is sufficient to raise said portion to a temperature exceeding on the order of about 1000°.

3. The apparatus of claim 2 wherein said portion is on the order of 1 cm along the slow axis and on the order of 66 microns along the fast axis.

4. The apparatus of claim 2 wherein said beam translation rate is sufficient to limit the depth of said portion to less than a thickness of the wafer.

5. The apparatus of claim 1 wherein said pyrometer includes a photodetector and a second optical filter passing said pyrometer wavelength and not passing said laser wavelength.

6. The apparatus of claim 1 wherein said source of laser radiation comprises an array of laser emitters and said first optical filter comprises a reflective surface angled relative to said array whereby to reflect light of said pyrometer wavelength to zones between adjacent ones of said emitters.

7. The apparatus of claim 6 further comprising a housing containing said array of laser emitters, said housing comprising a ceiling in an optical path of said array of laser emitters, said reflective surface being placed on said ceiling, said reflective surface and said ceiling being parallel to one another, said reflective surface being on an exterior surface of said ceiling.

8. The apparatus of claim 6 further comprising a housing containing said array of laser emitters, said housing comprising a ceiling in an optical path of said array of laser emitters, said reflective surface being placed on said ceiling, said reflective surface and said ceiling being parallel to one another, said reflective surface being on an interior surface of said ceiling.

9. Apparatus for processing a workpiece, wherein the workpiece has a workpiece surface, comprising:
- a source of heating radiation, wherein the heating radiation has at least one heating wavelength which the workpiece surface can absorb as heat;
- an optical element having a surface to reflect radiation at the heating wavelength and to pass radiation at a pyrometer wavelength;
- optics providing an optical line beam derived from the source of heating radiation, the optical line beam focused on the workpiece, the optics disposed between the surface of the optical element and the workpiece, the optical line beam defining a portion of the workpiece surface, which is smaller than the workpiece surface, within which illumination by the heating radiation is focused;
- line beam scanning apparatus coupled to the optics and having a fast axis transverse to the optical line beam along which the portion is translatable by the line beam scanning apparatus at a beam translation rate;
- a pyrometer positioned on a side of the surface of the optical element opposite said optics to receive an image of said portion through the optics, wherein the pyrometer is sensitive to the pyrometer wavelength; and
- a first optical filter disposed between the source of laser radiation and the surface of the optical element to block a part of the radiation spectrum from the source of heating radiation including the pyrometer wavelength.

10. The apparatus of claim 9 wherein said portion is sufficiently small so that the heating radiation focused thereon is sufficient to raise said portion to a temperature exceeding on the order of about 1000°.

11. The apparatus of claim 10 wherein said portion is on the order of 1 cm along the slow axis and on the order of 66 microns along the fast axis.

12. The apparatus of claim 10 wherein said beam translation rate is sufficient to limit the depth of said portion to less than a thickness of the workpiece.

13. The apparatus of claim 9 wherein said pyrometer includes a photodetector and a second optical filter passing said pyrometer wavelength and not passing said laser wavelength.

14. The apparatus of claim 9 wherein said source of heating radiation comprises an array of radiation emitters and said first optical filter comprises a reflective surface angled relative to said array whereby to reflect light of said pyrometer wavelength to zones between adjacent ones of said emitters.

15. The apparatus of claim 14 further comprising a housing containing said array of radiation emitters, said housing comprising a ceiling in an optical path of said array of emitters, said reflective surface being placed on said ceiling, said reflective surface and said ceiling being parallel to one another, said reflective surface being on an exterior surface of said ceiling.

16. The apparatus of claim 14 further comprising a housing containing said array of radiation emitters, said housing comprising a ceiling in an optical path of said array of emitters, said reflective surface being placed on said ceiling, said reflective surface and said ceiling being parallel to one another, said reflective surface being on an interior surface of said ceiling.

17. Apparatus for processing a workpiece, comprising:
- a source of heating radiation of a heating wavelength which workpiece material can absorb as heat;
- an optical element comprising a reflective surface to reflect radiation at said heating wavelength and to pass radiation at a pyrometer wavelength;
- optics providing an optical line beam derived from said heating radiation, said optical line beam focused on a focus location, said focus location corresponding to a workpiece surface when a workpiece is present, said optics disposed between said reflective surface and said focus location, said optical line beam illuminating an area at said focus location, said area corresponding to a portion which is less than an entire surface of a workpiece within which illumination by said heating radiation is focused;
- line beam scanning apparatus coupled to said optics and having a fast axis transverse to said optical line beam along which said surface region is translatable by said line beam scanning apparatus at a beam translation rate;
- a pyrometer positioned on a side of said reflective surface opposite said optics to receive an image of said portion through said optics, said pyrometer being sensitive to said pyrometer wavelength; and
- a first optical filter disposed between said source of heating radiation and said reflective surface to block a part of the radiation spectrum from said source of heating radiation including said pyrometer wavelength.

18. The apparatus of claim 17 wherein said portion is sufficiently small so that the heating radiation focused thereon is sufficient to raise said portion to a temperature exceeding on the order of about 1000°.

19. The apparatus of claim 18 wherein said portion is on the order of 1 cm along the slow axis and on the order of 66 microns along the fast axis.

20. The apparatus of claim 18 wherein said beam translation rate is sufficient to limit the depth of said portion to less than a thickness of the workpiece.

21. The apparatus of claim 17 wherein said pyrometer includes a photodetector and a second optical filter passing said pyrometer wavelength and not passing said laser wavelength.

22. The apparatus of claim 17 wherein said source of heating radiation comprises an array of radiation emitters and said first optical filter comprises a reflective surface angled relative to said array whereby to reflect light of said pyrometer wavelength to zones between adjacent ones of said emitters.

23. The apparatus of claim 22 further comprising a housing containing said array of radiation emitters, said housing comprising a ceiling in an optical path of said array of emitters, said reflective surface being placed on said ceiling, said reflective surface and said ceiling being parallel to one another, said reflective surface being on an exterior surface of said ceiling.

24. The apparatus of claim 22 further comprising a housing containing said array of radiation emitters, said housing comprising a ceiling in an optical path of said array of emitters, said reflective surface being placed on said ceiling, said reflective surface and said ceiling being parallel to one another, said reflective surface being on an interior surface of said ceiling.

* * * * *